(12) United States Patent
Tohnoe et al.

(10) Patent No.: US 8,178,439 B2
(45) Date of Patent: May 15, 2012

(54) SURFACE CLEANING AND SELECTIVE DEPOSITION OF METAL-CONTAINING CAP LAYERS FOR SEMICONDUCTOR DEVICES

(75) Inventors: Kazuhito Tohnoe, Clifton Park, NY (US); Frank M. Cerio, Jr., Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 108 days.

(21) Appl. No.: 12/749,782

(22) Filed: Mar. 30, 2010

(65) Prior Publication Data
US 2011/0244680 A1 Oct. 6, 2011

(51) Int. Cl.
*H01L 21/4763* (2006.01)

(52) U.S. Cl. .......... 438/633; 257/E21.214; 257/E21.23; 257/E21.304; 257/E21.483; 438/641; 438/650; 438/674; 438/692; 438/794

(58) Field of Classification Search .......... 257/E21.214, 257/E21.23, E21.304, E21.483; 438/633, 438/641, 650, 674, 692, 794
See application file for complete search history.

(56) References Cited

U.S. PATENT DOCUMENTS

| | | | |
|---|---|---|---|
| 5,358,743 A | 10/1994 | Hampden-Smith et al. | |
| 7,270,848 B2 | 9/2007 | Suzuki et al. | |
| 7,790,635 B2 * | 9/2010 | Balseanu et al. | 438/793 |
| 2002/0017641 A1 * | 2/2002 | Lu et al. | 257/3 |
| 2003/0173671 A1 | 9/2003 | Hironaga et al. | |
| 2004/0152255 A1 | 8/2004 | Seidl et al. | |
| 2004/0166674 A1 | 8/2004 | Chen et al. | |
| 2006/0121733 A1 | 6/2006 | Kilpela et al. | |
| 2007/0099420 A1 | 5/2007 | Dominguez et al. | |
| 2007/0184655 A1 | 8/2007 | Learn et al. | |
| 2007/0197023 A1 | 8/2007 | Widodo et al. | |
| 2007/0267723 A1 | 11/2007 | Bernstein et al. | |
| 2007/0269976 A1 | 11/2007 | Futase et al. | |
| 2007/0273044 A1 | 11/2007 | Yang et al. | |
| 2008/0042283 A1 | 2/2008 | Purushothaman et al. | |
| 2008/0150131 A1 | 6/2008 | Ruan et al. | |
| 2008/0315426 A1 | 12/2008 | Yang et al. | |
| 2008/0315429 A1 | 12/2008 | McFeely et al. | |
| 2009/0065939 A1 | 3/2009 | Suzuki | |
| 2009/0170314 A1 | 7/2009 | Morinaga et al. | |
| 2009/0186481 A1 | 7/2009 | Suzuki et al. | |
| 2009/0189287 A1 | 7/2009 | Yang et al. | |
| 2009/0197405 A1 | 8/2009 | Besling et al. | |
| 2009/0250815 A1 * | 10/2009 | Yang et al. | 257/750 |
| 2010/0015798 A1 | 1/2010 | Suzuki et al. | |
| 2010/0029071 A1 | 2/2010 | Russell et al. | |
| 2010/0081274 A1 | 4/2010 | Ishizaka et al. | |

(Continued)

OTHER PUBLICATIONS

U.S. Appl. No. 12/414,917 entitled "Surface Cleaning and Selective Deposition of Metal-Containing Cap Layers for Semiconductor Devices," First named inventor: Tadahiro Ishizaka, filed Mar. 31, 2009.

(Continued)

*Primary Examiner* — Asok Sarkar

(57) ABSTRACT

A method is provided for integrating metal-containing cap layers into copper (Cu) metallization of semiconductor devices. In one embodiment, the method includes providing a planarized patterned substrate containing metal surfaces and dielectric layer surfaces with a residue formed thereon, removing the residue from the planarized patterned substrate, and depositing metal-containing cap layers selectively on the metal surfaces by exposing the dielectric layer surfaces and the metal surfaces to a deposition gas containing metal-containing precursor vapor. The removing includes treating the planarized patterned substrate containing the residue with a reactant gas containing a hydrophobic functional group, and exposing the treated planarized patterned substrate to a reducing gas.

23 Claims, 8 Drawing Sheets

U.S. PATENT DOCUMENTS

2010/0197135 A1 8/2010 Ishizaka
2010/0210108 A1 8/2010 Ishizaka et al.

OTHER PUBLICATIONS

U.S. Patent and Trademark Office, International Search Report and Written Opinion received in related International Application No. PCT/US11/30115 dated May 25, 2011, 19 pp.

United States Patent and Trademark Office: Non-final Office Action issued on Oct. 19, 2010 in related U.S. Appl. No. 12/414,917, 17 pages.

United States Patent and Trademark Office: Non-final Office Action issued on Apr. 12, 2011 in related U.S. Appl. No. 12/414,917, 36 pages.

United States Patent and Trademark Office: Final Office Action issued on Oct. 26, 2011 in related U.S. Appl. No. 12/414,917, 36 pages.

* cited by examiner

SURFACE CLEANING AND SELECTIVE DEPOSITION OF METAL-CONTAINING CAP LAYERS FOR SEMICONDUCTOR DEVICES

CROSS-REFERENCE TO RELATED APPLICATION

The present invention is related to U.S. patent application Ser. No. 12/414,917, entitled "SELECTIVE DEPOSITION OF METAL-CONTAINING CAP LAYERS FOR SEMICONDUCTOR DEVICES", filed on Mar. 31, 2009. The entire contents of this application are incorporated herein by reference.

FIELD OF THE INVENTION

The present invention relates to semiconductor processing and semiconductor devices, and more particularly, to methods for integrating metal-containing cap layers into copper (Cu) metallization of semiconductor devices to improve electromigration (EM) and stress migration (SM) in bulk Cu metal.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal or interlayer dielectric layers that insulate the metal layers from each other. Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect. A "via" normally refers to any recessed feature such as a hole, line or other similar feature formed within a dielectric layer that, when filled with metal, provides an electrical connection through the dielectric layer to a conductive layer underlying the dielectric layer. Similarly, recessed features connecting two or more vias are normally referred to as trenches.

The use of Cu metal in multilayer metallization schemes for manufacturing integrated circuits has created several problems that require solutions. For example, high mobility of Cu atoms in dielectric materials and silicon (Si) can result in migration of Cu atoms into those materials, thereby forming electrical defects that can destroy an integrated circuit. Therefore, Cu metal layers, Cu filled trenches, and Cu filled vias are normally encapsulated with a barrier layer to prevent Cu atoms from diffusing into the dielectric materials. Barrier layers are normally deposited on trench and via sidewalls and bottoms prior to Cu deposition, and may include materials that are preferably non-reactive and immiscible in Cu, provide good adhesion to the dielectrics materials and can offer low electrical resistivity.

The electrical current density in an integrated circuit's interconnects significantly increases for each successive technology node due to decreasing minimum feature sizes. Because electromigration (EM) and stress migration (SM) lifetimes are inversely proportional to current density, EM and SM have fast become critical challenges. EM lifetime in Cu dual damascene interconnect structures is strongly dependent on atomic Cu transport at the interfaces of bulk Cu metal and surrounding materials which is directly correlated to adhesion at these interfaces. New materials that provide better adhesion and better EM lifetime have been studied extensively. For example, a cobalt-tungsten-phosphorus (CoWP) layer has been selectively deposited on bulk Cu metal using an electroless plating technique. The interface of CoWP and bulk Cu metal has superior adhesion strength that yields longer EM lifetime. However, maintaining acceptable deposition selectivity on bulk Cu metal, especially for tight pitch Cu wiring, and maintaining good film uniformity, has affected acceptance of this complex process. Furthermore, wet process steps using acidic solution may be detrimental to the use of CoWP.

Therefore, new methods are required for depositing metal-containing cap layers that provide good adhesion to Cu metal and improved EM and SM properties of bulk Cu metal. In particular, these methods should provide good selectivity for forming the metal-containing cap layers on Cu metal surfaces compared to dielectric layer surfaces.

SUMMARY OF THE INVENTION

Embodiments of the invention provide methods for manufacturing semiconductor devices by integrating metal-containing cap layers into Cu metallization to improve electromigration and stress migration in bulk Cu metal layers. The methods provide improved selective deposition of metal-containing cap layers on planarized patterned substrates containing metal surfaces and dielectric layer surfaces.

According to one embodiment of the invention, the method includes providing a planarized patterned substrate containing metal surfaces and dielectric layer surfaces with a residue formed thereon, removing the residue from the planarized patterned substrate, and depositing metal-containing cap layers selectively on the metal surfaces by exposing the dielectric layer surfaces and the metal surfaces to a deposition gas containing metal-containing precursor vapor. The removing includes treating the planarized patterned substrate containing the residue with a reactant gas containing a hydrophobic functional group, where the treating substitutes the hydrophilic functional group in the dielectric layer surfaces with a hydrophobic functional group, and exposing the treated planarized patterned substrate to a reducing gas.

According to another embodiment of the invention, the method includes providing a planarized patterned substrate containing Cu surfaces and low-k dielectric layer surfaces with a chemical mechanical polishing (CMP) residue formed thereon, removing the CMP residue from the planarized patterned substrate, and depositing metal-containing cap layers selectively on the Cu metal surfaces by exposing the dielectric layer surfaces and the Cu metal surfaces to a deposition gas containing metal-containing precursor vapor. The removing includes treating the planarized patterned substrate with a silicon-containing reactant gas containing a hydrophobic functional group, where the treating substitutes the hydrophilic functional group in the dielectric layer surfaces with a hydrophobic functional group, and exposing the treated planarized patterned substrate to $NH_3$ gas.

According to yet another embodiment of the invention, the method includes providing a planarized patterned substrate containing Cu surfaces and low-k dielectric layer surfaces with a CMP residue containing benzotriazine (BTA) formed thereon, removing the CMP residue from the planarized patterned substrate, and depositing ruthenium (Ru) metal cap layers selectively on the Cu surfaces by exposing the dielectric layer surfaces and the Cu surfaces to a deposition gas containing $Ru_3(CO)_{12}$ precursor vapor and CO carrier gas. The removing includes heat-treating the planarized patterned substrate to evaporate a first portion of the CMP residue from the planarized patterned substrate, thereafter, treating a second portion of the CMP residue on the planarized patterned substrate with an alkyl amine silane reactant gas, the treating substituting a hydrophilic functional group in the dielectric layer surfaces with a —Si—$(CH_3)_3$ functional group, and exposing the treated planarized patterned substrate to $NH_3$ gas.

BRIEF DESCRIPTION OF THE DRAWINGS

A more complete appreciation of embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Embodiments of the invention provide methods for integrating metal-containing cap layers into Cu metallization of semiconductor devices to improve electromigration and stress migration in the devices. Although the presence of metal-containing cap layers on metal surfaces (e.g., Cu surfaces or tungsten (W) surfaces) in semiconductor devices is extremely beneficial to the electromigration and stress migration properties of the metal layers, the presence of even trace amounts of additional metal-containing material on dielectric layer surfaces adjacent the metal layers is detrimental to the various electrical properties of a semiconductor device.

As the minimum feature sizes of semiconductor devices decrease and the thickness of the dielectric layers between adjacent metal layers decreases, electromigration and stress migration problems become increasingly more serious. In one example, a 32 nm minimum feature size device generation may utilize only about 45-50 nm dielectric thickness between adjacent metal layers, and trace amounts of additional metal-containing material on the dielectric layer surfaces can create a current leakage path between the adjacent metal layers, and strongly effect current (I)-voltage (V) and time-dependent-dielectric-breakdown (TDDB) behavior of the semiconductor devices.

One skilled in the relevant art will recognize that the various embodiments may be practiced without one or more of the specific details, or with other replacement and/or additional methods, materials, or component. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessary drawn to scale.

Reference throughout this specification to "one embodiment" means that a particular feature, structure, material, or characteristic described in connection with the embodiment is included in at least one embodiment of the invention, but do not denote that they are present in every embodiment. Thus, the appearances of the phrases "one embodiment" or "in an embodiment" in various places throughout this specification are not necessarily referring to the same embodiment of the invention.

Figure 1A:
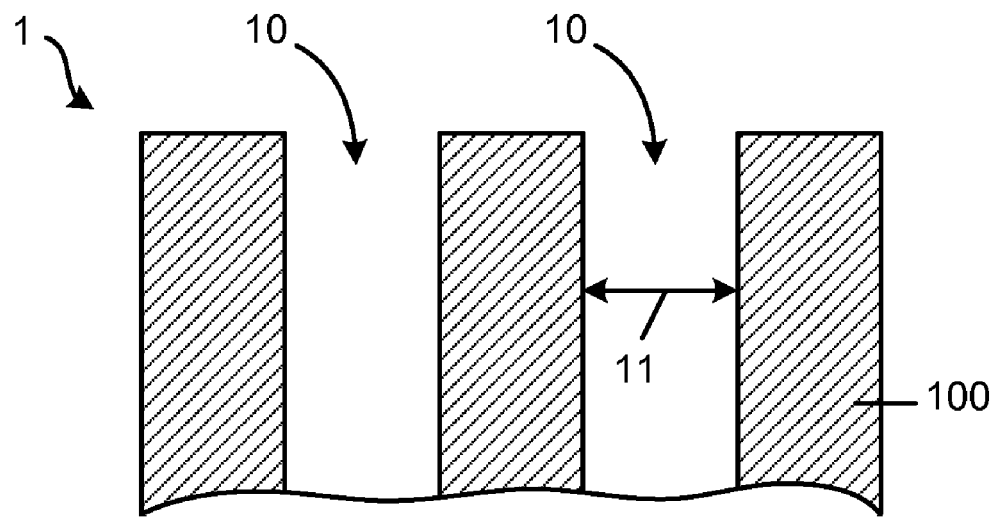
FIGS. 1A-1H show schematic cross-sectional views of formation of metal-containing cap layers in Cu metallization of a semiconductor device according to embodiments of the invention.

FIGS. 1A-1H show schematic cross-sectional views of formation of metal-containing cap layers in Cu metallization of a semiconductor device according to embodiments of the invention. FIG. 1A shows a patterned substrate 1 containing a plurality of recessed features 10 in a dielectric layer 100. The recessed features 10 may be formed using conventional lithography and plasma etching techniques. The recessed features 10 may be a part of high-aspect-ratio interconnect structures. The recessed features 10 can have an aspect ratio (depth/width) greater than or equal to about 2:1, for example 3:1, 4:1, 5:1, 6:1, 12:1, 15:1, or greater. The recessed features 10 have a width 11 that can be less than approximately 500 nm (nm=$10^{-9}$ m), for example 250 nm, 200 nm, 150 nm, 100 nm, 65 nm, 45 nm, 32 nm, 20 nm, or smaller. However, embodiments of the invention are not limited to these aspect ratios or feature widths, as other aspect ratios and feature widths may be utilized. It will be understood that embodiments of the invention may be applied to a variety of simple and complicated recessed features found in semiconductor manufacturing.

The dielectric layer 100 can, for example, contain $SiO_2$, a low-k dielectric material, or a high-k dielectric material. Low-k dielectric materials have a nominal dielectric constant less than the dielectric constant of $SiO_2$, which is approximately 4 (e.g., the dielectric constant for thermally grown silicon dioxide can range from 3.8 to 3.9). High-k materials have a nominal dielectric constant greater than the dielectric constant of $SiO_2$.

As is known to those in the semiconductor art, interconnect delay is a major limiting factor in the drive to improve the speed and performance of integrated circuits (ICs). One way to minimize interconnect delay is to reduce interconnect capacitance by using low-k materials during production of the ICs. Such low-k materials have also proven useful for low temperature processing. Thus, in recent years, low-k materials have been developed to replace relatively high dielectric constant insulating materials, such as silicon dioxide.

In particular, low-k films are being utilized for inter-level and intra-level dielectric layers between metal layers of semiconductor devices. Additionally, in order to further reduce the dielectric constant of insulating materials, material films are formed with pores, i.e., porous low-k materials. Such low-k materials can be deposited by a spin-on dielectric (SOD) method similar to the application of photo-resist, or by chemical vapor deposition (CVD).

Low-k dielectric materials may have a dielectric constant of less than 3.7, or a dielectric constant ranging from 1.6 to 3.7. Low-k dielectric materials can include fluorinated silicon glass (FSG), carbon doped oxide, a polymer, a SiCOH-containing low-k material, a non-porous low-k material, a porous low-k material, a spin-on dielectric (SOD) low-k material, or any other suitable dielectric material. The low-k dielectric material can include BLACK DIAMOND® (BD) or BLACK DIAMOND® II (BDII) SiCOH material, commercially available from Applied Materials, Inc., or Coral® CVD films commercially available from Novellus Systems, Inc. Other commercially available carbon-containing materials include SiLK® (e.g., SiLK-I, SiLK-J, SiLK-H, SiLK-D, and porous SiLK semiconductor dielectric resins) and CYCLOTENE® (benzocyclobutene) available from Dow Chemical, and GX-3™, and GX-3P™ semiconductor dielectric resins available from Honeywell.

Low-k dielectric materials include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

In addition, low-k materials include a silicate-based material, such as hydrogen silsesquioxane (HSQ) or methyl silsesquioxane (MSQ), deposited using SOD techniques. Examples of such films include FOx® HSQ commercially available from Dow Corning, XLK porous HSQ commercially available from Dow Corning, and JSR LKD-5109 commercially available from JSR Microelectronics.

While low-k materials are promising for fabrication of semiconductor circuits, integration of low-k materials (e.g., SiCOH materials) into semiconductor manufacturing presents several problems. Both non-porous and porous low-k materials tend to be brittle (i.e., have low cohesive strength, low elongation to break, and low fracture toughness), and less robust than more traditional dielectric materials and can be damaged during wafer processing, such as by etch and plasma ashing processes generally used in patterning the dielectric materials. Furthermore, liquid water and water vapor reduce the cohesive strength of the low-k material even further.

Figure 1B:
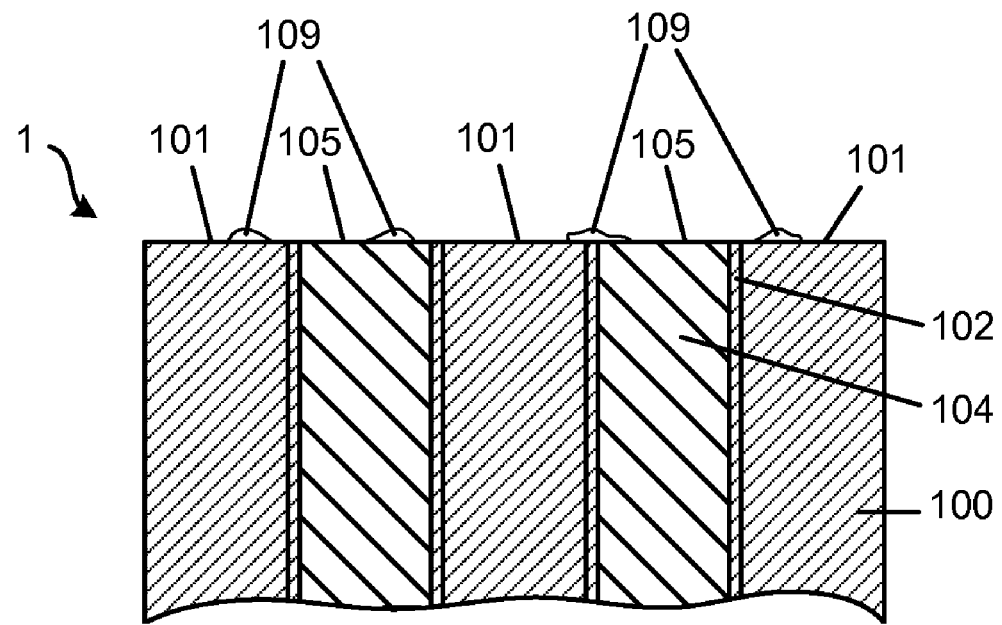

FIG. 1B shows the planarized patterned substrate 1 following further processing that forms a diffusion barrier layer 102 in the recessed features 10 of FIG. 1A, and metal layers 104 (e.g., Cu or W) filling the recessed features 10. The diffusion barrier layer 102 can, for example, contain a tantalum (Ta)-containing layer (e.g., Ta, TaC, TaN, or TaCN, or a combination thereof), a titanium (Ti)-containing layer (e.g., Ti, TiN, or a combination thereof), or a tungsten (W)-containing layer (e.g., W, WN, or a combination thereof), or a combination of two or more thereof. According to one embodiment of the invention, the diffusion barrier layer 102 may further contain an adhesion layer, e.g., a Ru metal layer or a metal alloy containing Ru metal, that is in direct contact with the metal layers 104 in the recessed features 10. In some examples, the diffusion barrier layer 102 can have a thickness that is less than approximately 5 nm. In one example, a thickness of a Ru metal adhesion layer can be approximately 2 nm.

Cu metal filling of the recessed features 10 may be performed by a Cu plating process, for example by an electrochemical plating process or by an electroless plating process, and a chemical mechanical polishing (CMP) process is conventionally performed following the Cu plating process to removed excess Cu metal. The CMP process may be optimized for Cu removal with high selectivity to the dielectric layer 100. CMP and Cu plating processes are well known to those skilled in the art. In FIG. 1B, the planarized patterned substrate 1 contains planarized metal surfaces 105 and dielectric layer surfaces 101.

FIG. 1B schematically further shows CMP residue 109 that can be present on the dielectric layer surfaces 101 and on the metal surfaces 105 following a CMP process. In one example, the CMP residue 109 can include benzotriazine (BTA) which is a chemical agent commonly used in a CMP process. However, the CMP residue 109 may contain other chemical agents used in CMP processing.

The structure of BTA is shown below.

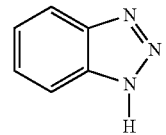

As those skilled in the art will readily appreciate, efficient removal of the CMP residue 109 is required prior to further processing of the planarized patterned substrate 1, including selective deposition of further material layers such as metal-containing cap layers on the metal surfaces 105 of the planarized patterned substrate 1. The inventors have realized that many conventional methods for cleaning CMP residue 109 from the metal surfaces 105 and the dielectric layer surfaces 101, including high temperature $H_2$ annealing and/or $H_2$ plasma processing, are not acceptable for manufacturing of many advanced semiconductor devices, including devices that contain low-k materials. These methods often do not satisfactorily clean the CMP residue 109 and other contaminants from the substrate surfaces, and may damage the low-k materials by the use of high temperatures and/or by plasma exposure.

Embodiments of the invention provide new low-temperature methods for cleaning CMP residue and other contaminants from planarized patterned surfaces prior to selective deposition of metal-containing cap layers on metal surfaces, such as metal surfaces 105, while preventing or minimizing formation of additional metal-containing material on the dielectric layer surfaces 101 between the metal surfaces 105. This improved selectivity provides an improved margin for line-to-line breakdown and electrical leakage performance in the semiconductor device containing the metal-containing cap layers.

According to one embodiment of the invention, following a CMP process, the planarized patterned substrate 1 depicted in FIG. 1B may be heat-treated in air or under vacuum conditions to remove a first portion of the CMP residue 109. The heat-treating may be performed at a temperature that is approximately equal to or greater than the boiling point of a material in the CMP residue 109. In one example, a CMP residue 109 containing BTA may be heat-treated at a temperature of approximately 210° C., or greater, to remove BTA present in a first portion (bulk) of the CMP residue. BTA has a boiling point of 209.4° C. It is contemplated that the heat-treating results in the remaining portion (a second portion) of the CMP residue 109 on the planarized patterned substrate 1 that is bonded directly to the metal surfaces 105 and the dielectric layer surfaces 101. Thus, in one example, the first portion of the CMP residue may contain multiple molecular layers of BTA and the second portion of the CMP residue may contain approximately a single molecular layer of BTA on the planarized patterned substrate 1.

Figure 1C:
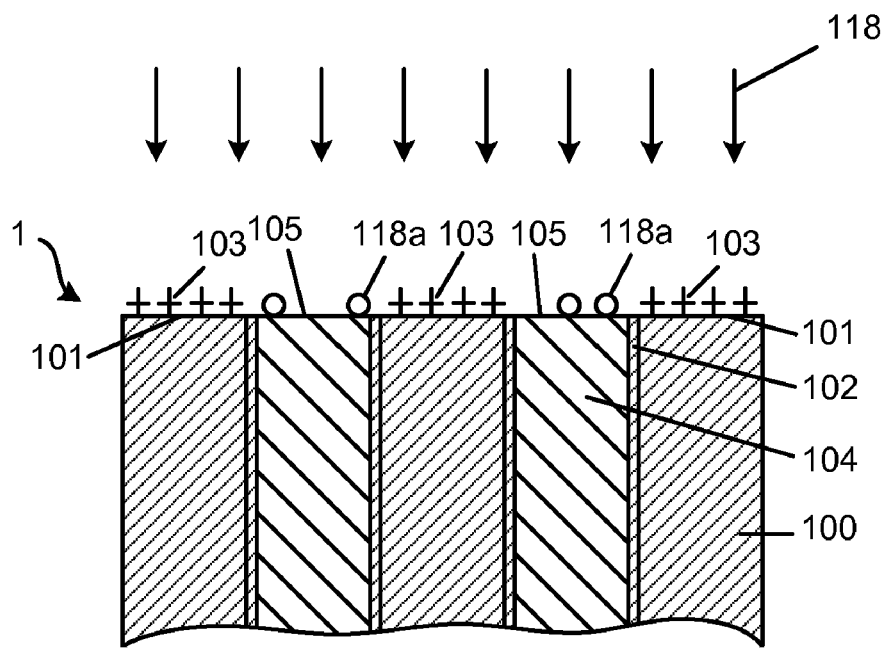

FIG. 1C schematically shows treating of the planarized patterned substrate 1 with a reactant gas 118 containing a hydrophobic functional group. The current inventors have discovered that the exposure of the planarized patterned substrate 1 to the reactant gas 118 at low temperature (e.g., between about 150° C. and about 250° C.) is effective for removing the CMP residue 109 from the planarized patterned substrate 1 and can replace conventional high temperature H₂ annealing or H₂ plasma processes that are not acceptable for manufacturing of many advanced semiconductor devices, including devices that contain low-k materials.

Figure 2A:
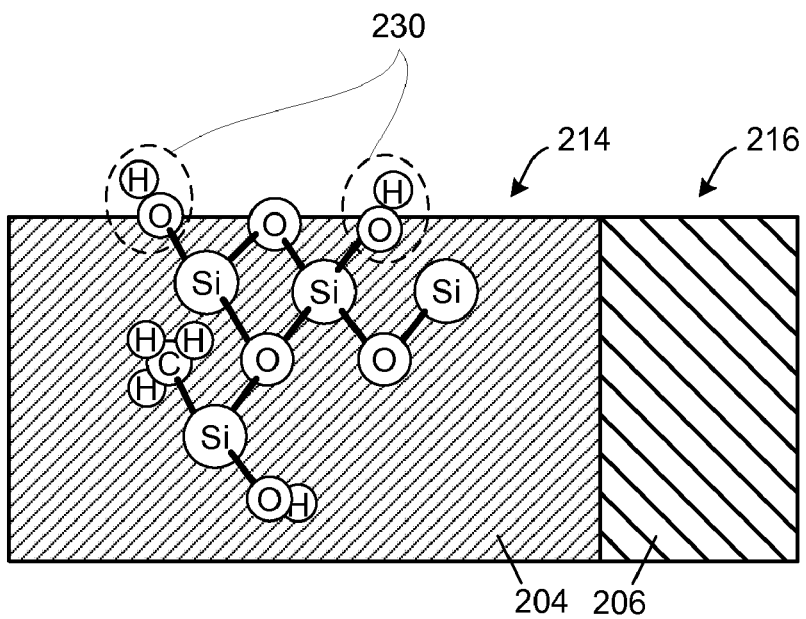
FIG. 2A shows a schematic cross-sectional view of a SiCOH low dielectric constant (low-k) layer containing a hydrophilic surface.

In addition to removing CMP residue 109 from the planarized patterned substrate 1, the exposure to the reactant gas 118 may substitute a hydrophilic functional group on dielectric layer surfaces 101 with the hydrophobic functional group from the reactant gas 118. FIG. 2A shows a schematic cross-sectional view of a planarized patterned substrate containing a metal layer 206 having a metal surface 216 and a low-k dielectric layer 204 containing a hydrophilic low-k dielectric layer surface 214. Removal of hydrophobic functional groups, e.g., —CH₃, from a surface of low-k materials containing Si—CH₃ groups during pattern etching or CMP are thought to provide unwanted adsorption sites for metal-containing precursors and reduce incubation time for metal-containing deposition onto the dielectric layer surfaces. Further, many low-k materials are porous and exposures of these materials to metal-containing precursor vapor may trap and react with the metal-containing precursor molecules in the pores.

The exemplary SiCOH low-k dielectric layer 204 contains a hydrophilic low-k dielectric layer surface 214 with hydrophilic functional groups 230. The exemplary hydrophilic functional groups 230 are hydroxyl groups (—OH groups) that may be formed by removal of —CH₃ groups from the SiCOH low-k dielectric layer 204 during pattern etching or CMP. The hydrophilic functional groups 230 are thought to provide unwanted adsorption sites for metal-containing precursors that significantly reduce the incubation time for metal-containing deposition on the hydrophilic low-k dielectric layer surface 214. Thus, selective deposition of a metal-containing layer on the metal surface 216 relative to on the hydrophilic low-k dielectric layer surface 214 is problematic.

Figure 2B:
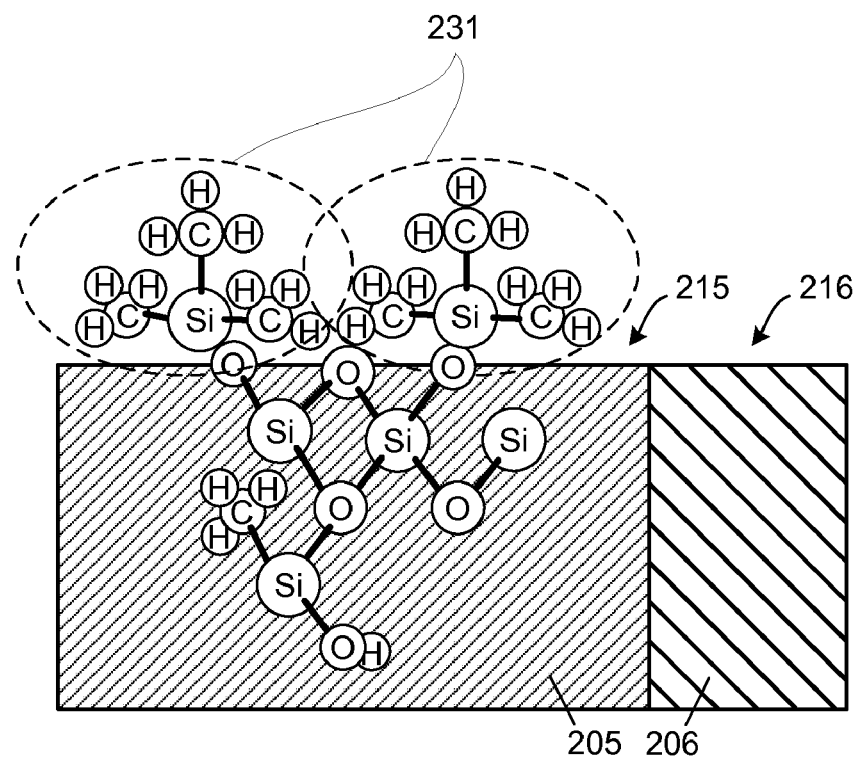
FIG. 2B shows a schematic cross-sectional view of a modified SiCOH low-k layer containing a hydrophobic surface according to an embodiment of the invention.

FIG. 2B shows a schematic cross-sectional view of a modified SiCOH low-k material containing a hydrophobic surface according to an embodiment of the invention. The modified SiCOH low-k dielectric layer 205 contains a hydrophobic low-k dielectric surface 215 with hydrophobic functional groups 231. Exemplary —Si(CH₃)₃ hydrophobic functional groups 231 are depicted in FIG. 2B. According to embodiments of the invention, the hydrophobic low-k dielectric layer surface 215 containing hydrophobic functional groups 231 may be prepared by exposing the hydrophilic low-k dielectric layer surface 214 in FIG. 2A to a reactant gas containing a hydrophobic functional group, thereby substituting the hydrophilic functional groups 230 with the hydrophobic functional group from the reactant gas. This substitution improves selective metal-containing deposition on the metal surface 216 and/or other metal-containing surfaces that have a short incubation time for metal-containing deposition, relative to on the hydrophobic low-k dielectric layer surface 215 that has a long incubation time. The hydrophobic low-k dielectric layer surface 215 contains few or no adsorption sites for metal-containing precursors and, therefore, an exposure of the hydrophobic low-k dielectric layer surface 215 to a metal-containing precursor results in a long incubation time and delayed metal-containing deposition on the hydrophobic low-k dielectric layer surface 215 relative to on the metal surface 216. This enables selective formation of a metal-containing layer on the metal surface 216 with little or no deposition on the hydrophobic low-k dielectric layer surface 215. Furthermore, in the case of a porous SiCOH low-k dielectric layer 204 and a modified porous SiCOH low-k dielectric layer 205, the hydrophobic functional group 231 may at least partially fill pores in porous SiCOH low-k dielectric layer 204, thereby preventing or reducing transport and subsequent reaction of metal-containing precursor molecules in the pores.

Referring back to FIG. 1C, according to some embodiments of the invention, the reactant gas 118 can contain a silicon-containing gas, including an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, an alkyl amine silane, a silazane, or any combination thereof. The exposure to the reactant gas 118 may be performed for a time period between about 10 seconds and about 120 minutes, or between about 30 seconds and about 60 seconds, at a gas pressure between about 0.1 Torr and about 10 Torr, or between about 1 Torr and about 5 Torr, at a substrate temperature between about 20° C. and about 300° C., between 150° C. and about 300° C., or between about 150° C. and about 250° C., for example. The reactant gas 118 may be plasma-excited (by a remote plasma or a direct plasma above the planarized patterned substrate 1) or the reactant gas may be exposed to the planarized patterned substrate 1 in the absence of plasma excitation.

According to some embodiments of the invention, the reactant gas may be contain an alkyl amine silane, for example dimethylsilane dimethylamine (DMSDMA), trimethylsilane dimethylamine (TMSDMA), bis(dimethylamino) dimethylsilane (BDMADMS), or other alkyl amine silanes. According to other embodiments, the reactant gas may be selected from N,O-bistrimethylsilyltrifluoroacetamide (BSTFA) and trimethylsilyl-pyrrole (TMS-pyrrole).

The structure of TMSDMA shown below.

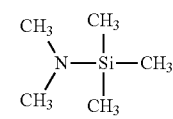

According to some embodiments of the invention, the reactant gas may be selected from silazane compounds. Silazanes are saturated silicon-nitrogen hydrides. They are analogous in structure to siloxanes with —NH-replacing —O—. An organic silazane precursor can further contain at least one alkyl group bonded to the Si atom(s). The alkyl group can, for example, be a methyl group, an ethyl group, a propyl group, or a butyl group, or combinations thereof. Furthermore, the alkyl group can be a cyclic hydrocarbon group such as a phenyl group. In addition, the alkyl group can be a vinyl group. Disilazanes are compounds having from 1 to 6 methyl groups attached to the silicon atoms or having 1 to 6 ethyl groups attached the silicon atoms, or a disilazane molecule having a combination of methyl and ethyl groups attached to the silicon atoms.

The structure of hexamethyldisilazane (HMDS) is shown below.

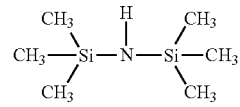

HMDS contains a Si—N—Si structural unit and three methyl groups bonded to each Si atom. HMDS is a commercially available silicon compound with a vapor pressure of about 20 Torr at 20° C.

Examples of organic silazane compounds are shown in TABLE 1.

TABLE 1

| | |
|---|---|
| Triethylsilazane | $SiC_6H_{17}N$ |
| Tripropylsilazane | $SiC_9H_{23}N$ |
| Triphenylsilazane | $SiC_{18}H_{17}N$ |
| Tetramethyldisilazane | $Si_2C_4H_{15}N$ |
| Hexamethyldisilazane | $Si_2C_6H_{19}N$ |
| Hexaethyldisilazane | $Si_2C_{12}H_{31}N$ |
| Hexaphenyldisilazane | $Si_2C_{36}H_{31}N$ |
| Heptamethyldisilazane | $Si_2C_7H_{21}N$ |
| Dipropyl-tetramethyldisilazane | $Si_2C_{10}H_{27}N$ |
| Di-n-Butyl-tetramethyldisilazane | $Si_2C_{12}H_{31}N$ |
| Di-n-Octyl-tetramethyldisilazane | $Si_2C_{20}H_{47}N$ |
| Triethyl-trimethylcyclotrisilazane | $Si_2C_9H_{27}N_3$ |
| Hexamethylcyclotrisilazane | $Si_3C_6H_{21}N_3$ |
| Hexaethylcyclotrisilazane | $Si_3C_{12}H_{33}N_3$ |
| Hexaphenylcyclotrisilazane | $Si_3C_{36}H_{33}N_3$ |
| Octamethylcyclotetrasilazane | $Si_4C_8H_{28}N_4$ |
| Octaethylcyclotetrasilazane | $Si_4C_{16}H_{44}N_4$ |
| Tetraethyl-tetramethylcyclotetrasilazane | $Si_4C_{12}H_{36}N_4$ |
| Cyanopropylmethylsilazane | $SiC_5H_{10}N_2$ |
| Tetraphenyldimethyldisilazane | $Si_2C_{26}H_{27}N$ |
| Diphenyl-tetramethyldisilazane | $Si_2C_{16}H_{23}N$ |
| Trivinyl-trimethylcyclotrisilazane | $Si_3C_9H_{21}N_3$ |
| Tetravinyl-tetramethylcyclotetrasilazane | $Si_4C_{12}H_{28}N_4$ |
| Divinyl-tetramethyldisilazane | $Si_2C_8H_{19}N$ |

In addition to removing the CMP residue 109, the exposure of the planarized patterned substrate 1 to the reactant gas 118 may form modified dielectric layer surfaces 103 by substituting a hydrophilic functional group (e.g., —OH group) in the dielectric layer surfaces 101 with a hydrophobic functional group (e.g., —Si(CH$_3$)$_3$ group) from the reactant gas 118. The hydrophobic functional group is depicted by a "+" symbol on the modified dielectric layer surfaces 103. As shown in FIG. 1C, exposure of the planarized patterned substrate 1 to the reactant gas 118 may further result in small amounts of adsorbed reactant gas 118a on the metal surfaces 105.

Figure 1D:
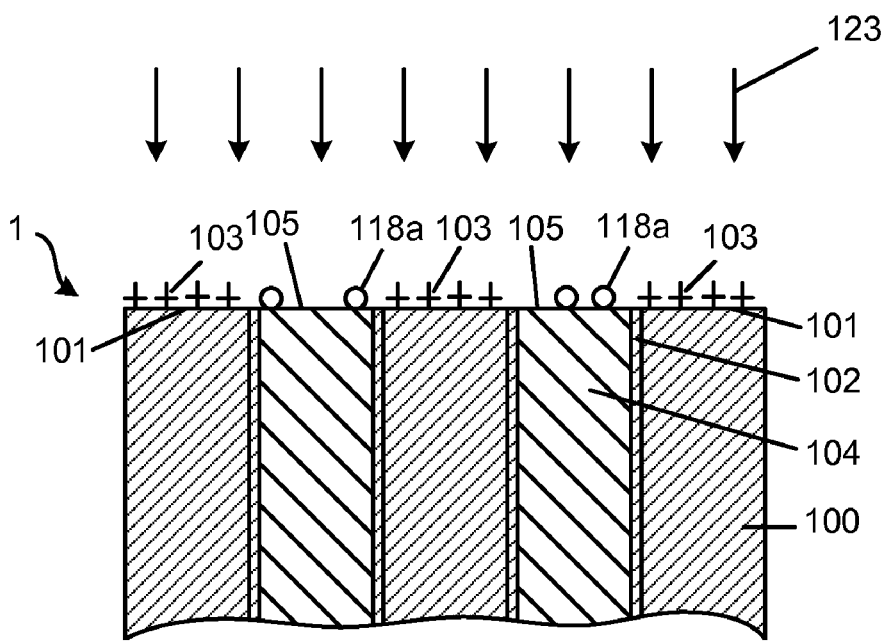

Referring now to FIG. 1D, following the exposure of the reactant gas 118, the planarized patterned substrate 1 is heat-treated in the presence of a reducing gas 123, for example hydrogen (H$_2$) gas or ammonia (NH$_3$) gas, in the absence of plasma excitation. It is contemplated that the reducing gas exposure chemically reduces oxidized metal (e.g., CuO) to the corresponding metal (e.g., Cu) on the metal surfaces 105. It is further contemplated that NH$_3$ gas exposure substitutes an unreacted hydrophilic functional group (e.g., —OH group) in the dielectric layer surfaces 101 with an —NH$_x$ group (—NH$_2$ or —NH group), thereby further improving selective metal-containing deposition on the metal surfaces 105 relative to the dielectric layer surfaces 101. The NH$_3$ gas exposure may further remove any remaining organic contaminants from the metal surfaces 105. According to some embodiments, the NH$_3$ gas exposure may at least partially remove the hydrophobic functional group from the modified dielectric layer surfaces 103 and substitute with an —NH$_x$ group. However, according to other embodiments, the hydrophobic functional group may remain on the modified dielectric layer surfaces 103 during the NH$_3$ gas exposure. In one example, the substrate temperature may be controlled and increased to enhance removal of the hydrophobic functional group from modified dielectric layer surfaces 103 prior to deposition of metal-containing cap layers on the metal surfaces 105.

Figure 1E:
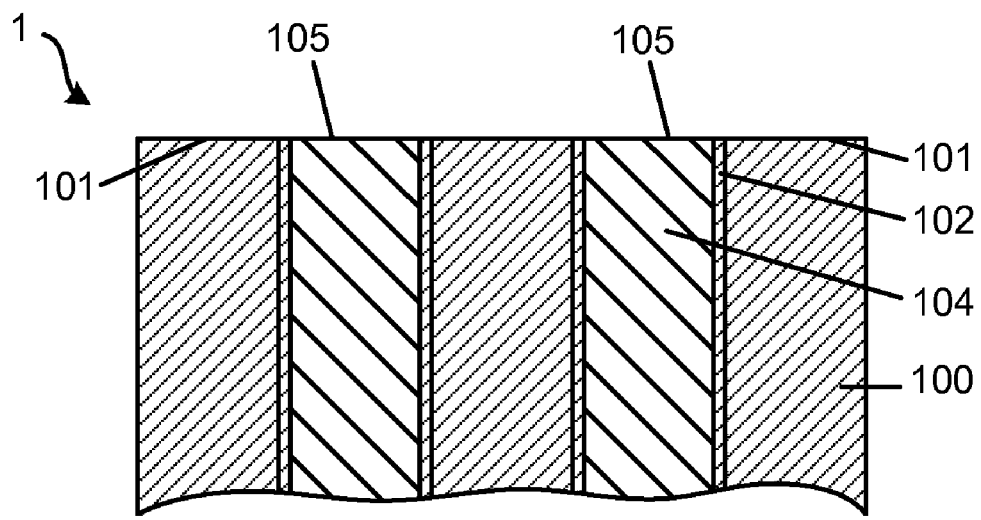

FIG. 1E shows a planarized patterned substrate 1 following the heat-treating with the reducing gas 123 according to one embodiment of the invention. In the embodiment depicted in FIG. E, the hydrophobic functional group (e.g., —Si(CH$_3$)$_3$ group) has been removed from the modified dielectric layer surfaces 103 by the reducing gas exposure and the adsorbed reactant gas 118a has been removed from the metal surfaces 105.

Figure 1F:
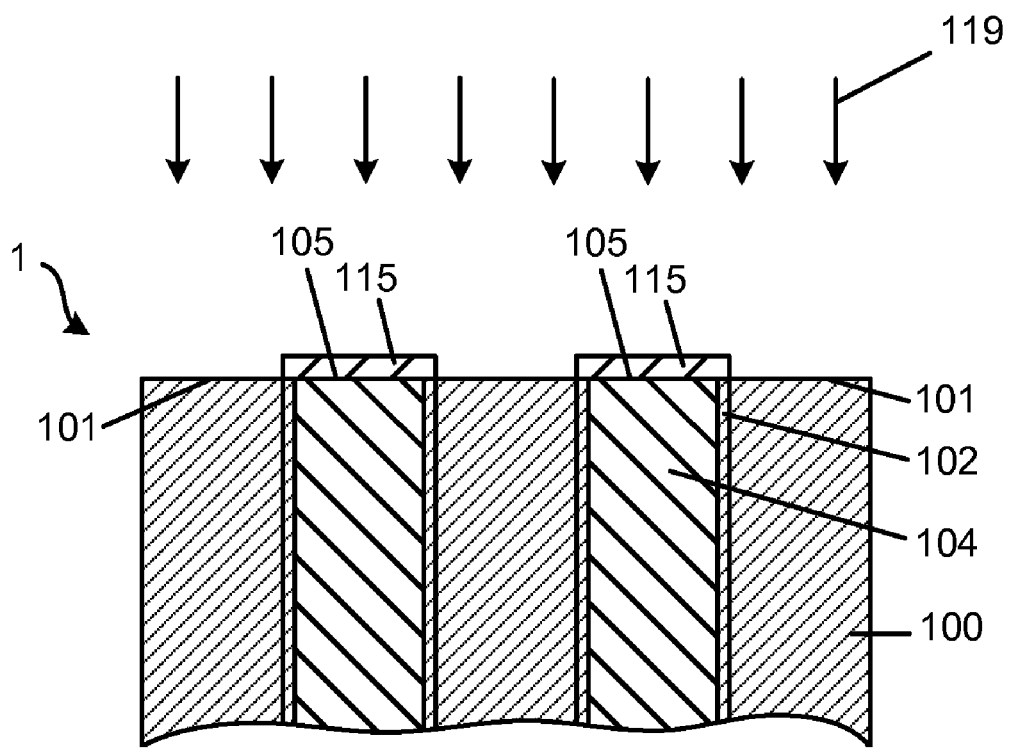

FIG. 1F schematically shows exposure of the planarized patterned substrate 1 to a deposition gas 119 containing metal-containing precursor vapor according to one embodiment of the invention. The deposition gas 119 can further contain a carrier gas (e.g., an inert gas), a reducing gas, or both a carrier gas and a reducing gas. The metal-containing precursor vapor can contain a metal-containing precursor that may be selected from ruthenium (Ru)-containing precursors, cobalt (Co)-containing precursors, molybdenum (Mo)-containing precursors, tungsten (W)-containing precursors, platinum (Pt)-containing precursors, iridium (Ir)-containing precursors, rhodium (Rh)— containing precursors, and rhenium (Re)-containing precursors. Exemplary Ru-containing precursors include Ru$_3$(CO)$_{12}$, (2,4-dimethylpentadienyl)(ethylcyclopentadienyl)ruthenium (Ru(DMPD)(EtCp)), bis (2,4-dimethylpentadienyl)ruthenium (Ru(DMPD)$_2$), 4-dimethylpentadienyl)(methylcyclopentadienyl)ruthenium (Ru (DMPD)(MeCp)), or bis(ethylcyclopentadienyl)ruthenium (Ru(EtCp)$_2$). Exemplary Co precursors include Co$_2$(CO)$_8$, Co$_4$(CO)$_{12}$, CoCp(CO)$_2$, Co(CO)$_3$(NO), CO$_2$(CO)$_6$(HC-C'Bu), Co(acac)$_2$, Co(Cp)$_2$, Co(Me$_5$Cp)$_2$), Co(EtCp)$_2$, cobalt (II) hexafluoroacetylacetonate hydrate, cobalt tris(2,2,6,6-tetramethyl-3,5-heptanedionate), cobalt(III) acetylacetonate, bis(N,N'diisopropylacetamidinato) cobalt, and tricarbonyl allyl cobalt. One exemplary Mo precursor is Mo(CO)$_6$. Exemplary W precursors include W(CO)$_6$ and tungsten halides (WX$_6$, where X is a halogen). Exemplary Pt precursors include Pt(CO)$_2$Cl$_2$, Pt(acac)$_2$, Me$_2$PtC$_5$H$_5$, Pt(PF$_3$)$_4$, and MeCpPtMe$_3$. Exemplary Ir precursors include Ir$_4$(CO)$_{12}$, Ir(allyl)$_3$, (methylcyclopentadienyl)(1,5-cyclooctadiene)iridium(I), (C$_6$H$_7$)(C$_8$H$_{12}$)Ir, and IrCl$_3$. Exemplary Rh precursors include Rh(acac)(CO)$_2$, ($\eta^5$-C$_5$H$_5$)Rh(H$_2$C=CH$_2$)$_2$, ($\eta^5$-C$_5$H$_5$)Rh(CO)$_2$, and RhCl$_3$. One exemplary Re precursor is Re$_2$(CO)$_{10}$. It will be appreciated by those skilled in the art that a number of other metal-containing precursors may be used in embodiments of the present invention.

In FIG. 1F, the exposure to the deposition gas 119 selectively deposits metal-containing cap layers 115 onto the metal surfaces 105, and as depicted in FIG. 1F, little or no metal-containing deposition occurs on the dielectric layer surfaces 101 due to lack of adsorption sites for the metal-containing precursors on the dielectric layer surfaces 101. Although not shown in FIG. 1F, the dielectric layer surfaces 101 may further contain hydrophobic functional groups that may further block metal-containing deposition on the dielectric layer surfaces 101. The metal-containing cap layers 115 may contain metal layers, metal compound layers, or alternating layers of metal layers and metal compound layers. In one example, an average thickness of the metal-containing cap layers 115 can be between 2 angstrom (angstrom=$10^{-10}$ m) and 200 angstrom, for example about 2, 5, 10, 15, 20, 30, 40, 50, 100, or 200 angstrom. In some examples, the metal-containing cap layers 115 may have an average thickness between 2 and 5 angstrom. However, embodiments of the invention are not limited to those thicknesses and the metal-containing cap layers 115 may be thicker than 200 angstrom. According to one embodiment, a surface coverage of the metal-containing cap layers 115 on the metal surfaces 105 may be incomplete with gaps that expose the metal surfaces 105.

According to some embodiments of the invention, the metal-containing cap layers 115 may contain or consist of one or more metal layers. The metal layers may contain a metal element selected from Ru, Co, Mo, W, Pt, Ir, Rh, or Re, or a combination thereof. In some examples, the metal-containing cap layers 115 may be deposited on the planarized patterned substrate 1 by exposing the planarized patterned substrate 1 to the deposition gas 119 using chemical vapor deposition (CVD), plasma enhanced CVD (PECVD), atomic layer deposition (ALD), or plasma-enhanced ALD (PEALD) techniques. In one example, the metal-containing cap layers 115 may contain or consist of Ru metal and the diffusion barrier layer 102 may contain a Ru metal adhesion layer in direct contact with the metal layers 104. Thus, the portion of the metal layers 104 shown in FIG. 1F may be encapsulated with Ru metal.

According to other embodiments of the invention, the metal-containing cap layers 115 may contain or consist of metal compound layers. The metal compound layers may contain a metal element, for example one or more of the abovementioned metal elements, and a dopant. For example, the dopant may be a non-metal dopant element selected from phosphorus (P), boron (B), nitrogen (N), fluorine (F), chlorine (Cl), bromine (Br), silicon (Si), or germanium (Ge), or a combination thereof. In some embodiments, the metal compound layers may be deposited on the metal surfaces 105 by exposing the planarized patterned substrate 1 to a deposition gas 119 containing metal-containing precursor vapor and a dopant gas. For example, the dopant gas may contain or consist of a non-metal dopant gas selected from $PH_3$, $BH_3$, $B_2H_6$, $BF_3$, $NF_3$, $NH_3$, $N_2$, $N_2H_4$, $PF_3$, $PBr_3$, $BCl_3$, $BI_3$, $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, $Si_2F_6$, $GeH_4$ or $GeCl_4$, or a combination of two or more thereof. In other embodiments, other Si-containing or Ge-containing non-metal dopant gases may be utilized.

Figure 1G:
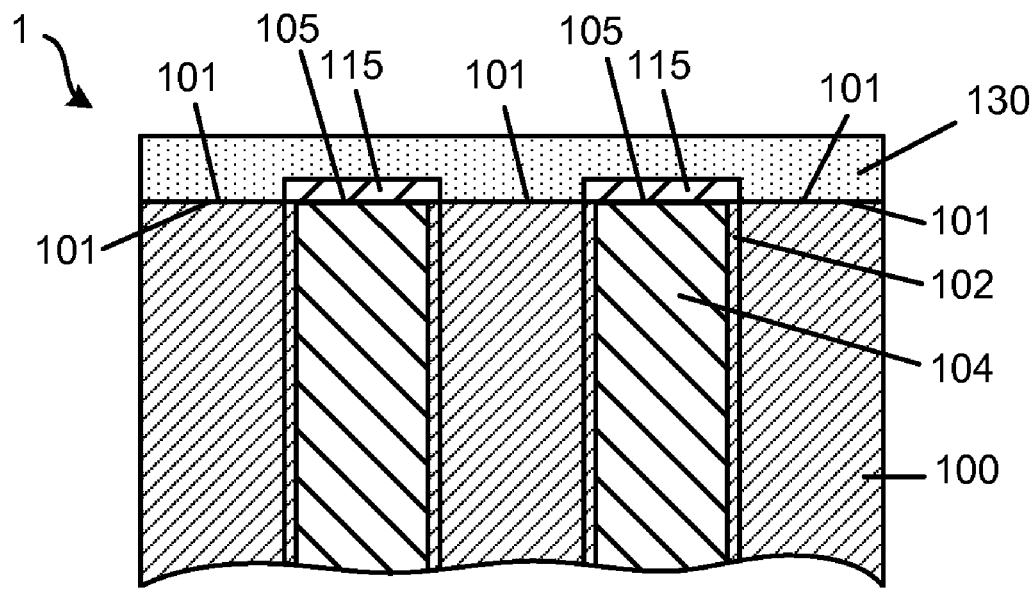

FIG. 1G shows a dielectric diffusion barrier layer 130 formed on the metal-containing cap layers 115 and on the dielectric layer surfaces 101 after further processing of the planarized patterned substrate 1 in FIG. 1F. The dielectric diffusion barrier layer 130 can, for example, contain silicon nitride (SiN), silicon carbide (SiC), or silicon carbonitride (SiCN).

Figure 1H:
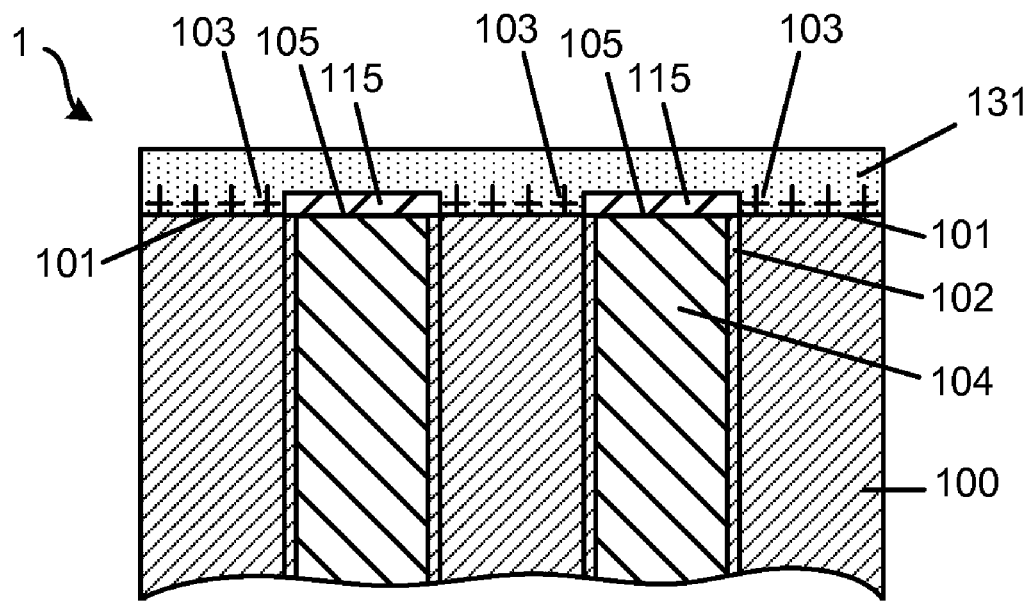

According to another embodiment, the processing conditions with the reducing gas exposure in FIG. 1D may be selected such that the hydrophobic functional group is not substantially removed from the modified dielectric layer surfaces 103. FIG. 1H shows a second dielectric diffusion barrier layer 131 formed on the metal-containing cap layers 115 and on the modified dielectric layer surfaces 103. The second dielectric diffusion barrier layer 131 can, for example, contain SiN, SiC, or SiCN.

Figure 3:
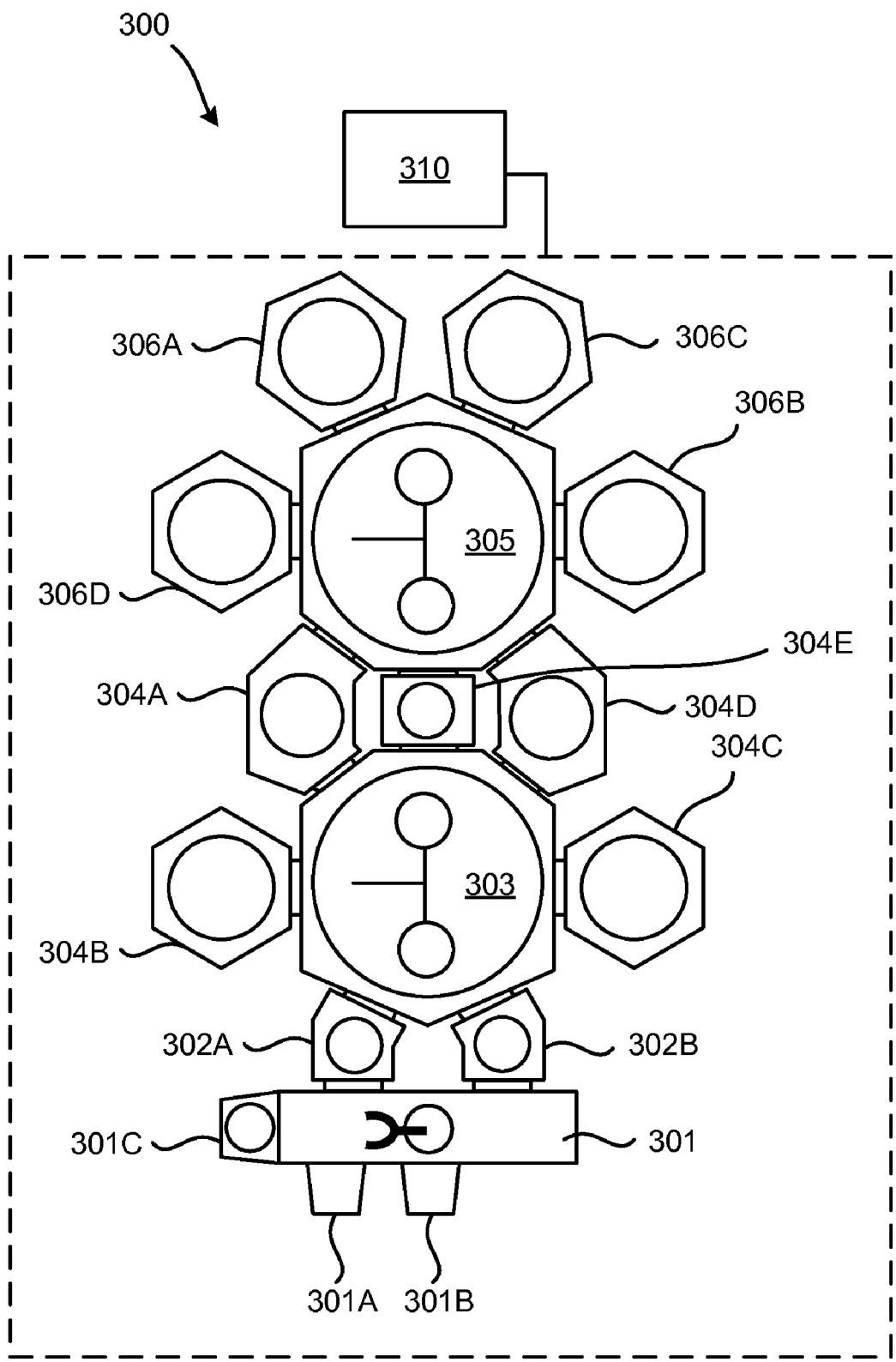
FIG. 3 is a schematic diagram of a vacuum processing tool for performing integrated processing according to embodiments of the invention.

FIG. 3 is a schematic diagram of a vacuum processing tool for performing integrated processing according to embodiments of the invention. The vacuum processing tool 300 contains a substrate (wafer) transfer system 301 that includes cassette modules 301A and 301B, and a substrate alignment module 301C. Load-lock chambers 302A and 302B are coupled to the substrate transfer system 301. The substrate transfer system 301 is maintained at atmospheric pressure but a clean environment is provided by purging with an inert gas.

The load lock chambers 302A and 302B are coupled to a substrate transfer system 303. The substrate transfer system 503 may be maintained at a very low base pressure (e.g., $5 \times 10^{-8}$ Torr, or lower) or constantly purged with an inert gas, using a turbomolecular pump (not shown). The substrate transfer system 303 includes a substrate transfer robot and is coupled to degassing systems 304A and 304D, processing system 304B configured for exposing the substrates to a reactant gas containing hydrophobic functional groups, and processing system 304C configured for exposing the substrates to a reducing gas (e.g., $H_2$ or $NH_3$).

Furthermore, the substrate transfer system 303 is coupled to a substrate transfer system 305 through substrate handling chamber 304E. As in the substrate transfer system 303, the substrate transfer system 305 may be maintained at a very low base pressure (e.g., $5 \times 10^{-8}$ Torr, or lower) or constantly purged with an inert gas, using a turbomolecular pump (not shown). The substrate transfer system 305 includes a substrate transfer robot. Coupled to the substrate transfer system 305 are processing systems processing systems 306A and 306D configured for exposing the patterned substrates to a deposition gas to deposit metal-containing cap layers onto the substrates, processing system 306C for optionally exposing metal-containing cap layers to a dopant gas, and processing system 306B for depositing a dielectric diffusion barrier layer on the substrates.

According to one embodiment of the invention, the processing system 306A may be a Ru CVD system configured for utilizing a deposition gas containing $Ru_3(CO)_{12}$ and CO for depositing Ru metal cap layers. Exemplary Ru CVD systems are described in U.S. Pat. Nos. 7,270,848 and 7,279,421.

The vacuum processing tool 300 includes a controller 310 that can be coupled to and control any or all of the processing systems and processing elements depicted in FIG. 3 during the integrated substrate processing. Alternatively, or in addition, controller 310 can be coupled to one or more additional controllers/computers (not shown), and controller 310 can obtain setup and/or configuration information from an additional controller/computer. The controller 310 can be used to configure any or all of the processing systems and processing elements, and the controller 310 can collect, provide, process, store, and display data from any or all of the processing systems and processing elements. The controller 310 can comprise a number of applications for controlling any or all of the processing systems and processing elements. For example, controller 310 can include a graphic user interface (GUI) component (not shown) that can provide easy to use interfaces that enable a user to monitor and/or control one or more processing systems processing elements.

The controller 310 can include a microprocessor, memory, and a digital I/O port capable of generating control voltages sufficient to communicate, activate inputs, and exchange information with the vacuum processing tool 300 as well as monitor outputs from the vacuum processing tool 300. For example, a program stored in the memory may be utilized to activate the inputs of the vacuum processing tool 300 according to a process recipe in order to perform integrated substrate processing. The controller 310 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 310 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 310, for driving a device or devices for implementing the invention, and/or for enabling the controller 310 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 310 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 310.

The controller 310 may be locally located relative to the vacuum processing tool 300, or it may be remotely located relative to the vacuum processing tool 300. For example, the controller 310 may exchange data with the vacuum processing tool 300 using at least one of a direct connection, an intranet, the Internet and a wireless connection. The controller 310 may be coupled to an intranet at, for example, a customer site (i.e., a device maker, etc.), or it may be coupled to an intranet at, for example, a vendor site (i.e., an equipment manufacturer). Additionally, for example, the controller 310 may be coupled to the Internet. Furthermore, another computer (i.e., controller, server, etc.) may access, for example, the controller 310 to exchange data via at least one of a direct connection, an intranet, and the Internet. As also would be appreciated by those skilled in the art, the controller 310 may exchange data with the vacuum processing tool 300 via a wireless connection.

As those skilled in the art will readily recognize, embodiments of the invention may not require the use of all the processing systems of the vacuum processing tool 300 depicted in FIG. 3. As described above, the vacuum processing tool 300 may contain two processing system (e.g., processing systems 306A and 306D) configured for performing the same or similar processing. This may be done in order to increase wafer throughput of the vacuum processing tool 300. Thus, some embodiments of the invention may include the use of less than all the processing systems depicted in FIG. 3 and further, the processing systems may be arranged differently than shown in FIG. 3.

Figure 4:
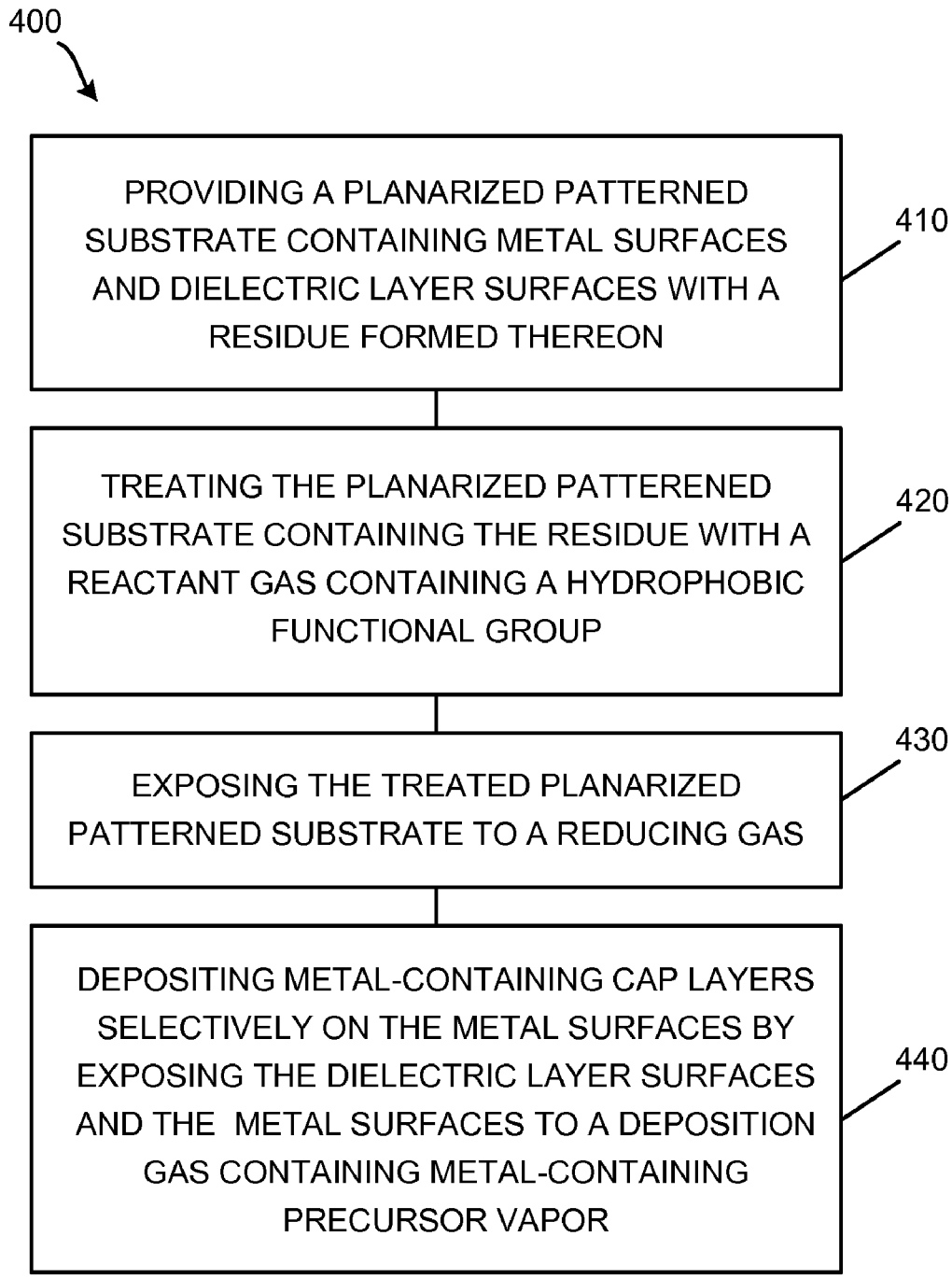
FIG. 4 is a process flow diagram for surface cleaning and selective formation of metal-containing cap layers on a planarized patterned substrate according to an embodiment of the invention.

FIG. 4 is a process flow diagram for surface cleaning and selective formation of metal-containing cap layers on a planarized patterned substrate according to an embodiment of the invention. Referring also to FIGS. 1A-1H and FIG. 3, the process 400 includes, at 410, providing in a vacuum processing tool 300a planarized patterned substrate 1 containing metal surfaces 105 and dielectric layer surfaces 101 with a residue 109 formed thereon. According to one embodiment, the residue can include a CMP residue containing benzotriazine (BTA).

The planarized patterned substrate 1 may be loaded using cassette modules 301A and 301B, aligned in the substrate alignment module 301C, and pumped down using load lock chambers 302A or 302B. Thereafter, the planarized patterned substrate 1 may be introduced into degassing systems 304A or 304D by the substrate transfer system 303. According to one embodiment of the invention, in the degassing systems 304A or 304D, the planarized patterned substrate 1 may be heat-treated under vacuum conditions to evaporate a first portion of the CMP residue 109 from the planarized patterned substrate 1. According to another embodiment, the planarized patterned substrate 1 may be heat-treated under vacuum conditions in an alternate vacuum processing tool or in air to evaporate a first portion of the CMP residue 109 from the planarized patterned substrate 1 prior to introducing the planarized patterned substrate 1 into the vacuum processing tool 300.

At 420, the planarized patterned substrate 1 is exposed to a reactant gas 118 containing hydrophobic functional groups in processing systems 304B. The exposure modifies the dielectric layer surfaces 101 by substituting a hydrophilic functional group on the dielectric layer surfaces 101 with the hydrophobic functional group. The reactant gas 118 may include a silicon-containing reactant gas containing an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, an alkyl amine silane, a silazane, or any combination thereof.

At 430, the planarized patterned substrate 1 is exposed to a reducing gas, in the processing system 304C. The reducing gas exposure may chemically reduce oxidized metal (e.g., CuO) to the corresponding metal (e.g., Cu) on the metal surfaces 105 and a $NH_3$ gas exposure may further substitute an unreacted hydrophilic functional group (e.g., —OH group) in the dielectric layer surfaces 101 with an —$NH_2$ or —NH group. According to some embodiments, the $NH_3$ gas exposure may at least partially remove the hydrophobic functional group from the dielectric layer surfaces 101 and substitute with an —$NH_2$ or —NH group. However, according to other embodiments, the hydrophobic functional group may remain on the dielectric layer surfaces 101 during the $NH_3$ gas exposure. In one example, the substrate temperature may be controlled and increased to enhance removal of the hydrophobic functional group from the dielectric layer surfaces 101 prior to deposition of metal-containing cap layers on the metal surfaces 105. In one example, the planarized patterned substrates 1 may be heat-treated under vacuum conditions between steps 420 and 430.

According to some embodiments of the invention, the exposure to the reactant gas 118, the exposure to the reducing gas, or both the exposures to the reactant gas and the exposure to the reducing gas may be performed at a substrate temperature between about 20° C. and about 300° C., between 150° C. and about 300° C., or between about 150° C. and about 250° C., for example.

At 440, metal-containing cap layers 115 are selectively deposited on the metal surfaces 105 of the planarized patterned substrate 1 in the processing system 306A or in the processing system 306D by exposing the dielectric layer surfaces 101 and the metal surfaces 105 to a deposition gas containing metal-containing precursor vapor. The metal-containing precursor vapor can contain a metal element selected from Pt, Au, Ru, Co, W, Rh, Ir, or Pd, or a combination of two or more thereof. In some embodiments, the deposition gas may further include a non-metal dopant gas selected from $PH_3$, $BH_3$, $B_2H_6$, $BF_3$, $NF_3$, $NH_3$, $N_2H_4$, $PF_3$, $PBr_3$, $BCl_3$, $BI_3$, $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, $Si_2F_6$, $GeH_4$, or $GeCl_4$, or a combination of two or more thereof.

Alternately, metal-containing cap layers 115 may be formed on the metal surfaces 105 of the planarized patterned substrate 101 by exposing the dielectric layer surfaces 101 and the metal surfaces 105 to the metal-containing precursor vapor in the processing system 306A or in the processing system 306D to deposit metal layers selectively on the metal surfaces 105, where the metal layers contain Pt, Au, Ru, Co, W, Rh, Ir, or Pd, or a combination of two or more thereof. Thereafter, the planarized patterned substrate 1 may be transferred to the processing system 306C to incorporate a dopant into the metal layers by exposing the deposited metal layers to a dopant gas selected from $PH_3$, $BH_3$, $B_2H_6$, $BF_3$, $NF_3$, $NH_3$, $N_2$, $N_2H_4$, $PF_3$, $PBr_3$, $BCl_3$, $BI_3$, $SH_4$, $Si_2H_6$, $SiH_3Cl$, $SH_2Cl_2$, $SiHCl_3$, $SiCl_4$, $Si_2Cl_6$, $SiH_3F$, $SiH_2F$, $SiHF_3$, $SiF_4$, $Si_2F_6$, $GeH_4$, or $GeCl_4$, or a combination of two or more thereof. According to one embodiment of the invention, processing system 306C may be a GCIB processing system.

Next, the planarized patterned substrate 1 may be returned to the substrate transfer system 305, the substrate handling chamber 304E, the substrate transfer system 303, the load lock chambers 302A or 302B, and returned to the cassette modules 301A or 301B and removed from the vacuum processing tool 300 for further processing. Alternately, the planarized patterned substrate 1 may be introduced into the processing system 306B for depositing a dielectric diffusion barrier layer 130 on the metal-containing cap layers 115 and on the dielectric layer surfaces 101. The dielectric diffusion barrier layer 130 can, for example, contain silicon nitride (SiN), silicon carbide (SiC), or silicon carbonitride (SiCN). Thereafter, the planarized patterned substrate 1 may be returned to the substrate transfer system 305, the substrate handling chamber 304E, the substrate transfer system 303, the load lock chambers 302A or 302B, and returned to the cassette modules 301A or 301B and removed from the vacuum processing tool 300 for further processing.

According to another embodiment, one or more external processing systems configured for exposing a planarized patterned substrate 1 to a reactant gas 118 containing hydrophobic functional groups may be decoupled from the vacuum processing tool 300. In one example, the planarized patterned substrate 1 may be exposed to a reactant gas 118 in the one or more external processing systems and, thereafter, exposed to air and transferred to the vacuum processing tool 300 for further processing, including degassing, exposing the planarized patterned substrate 1 to a reducing gas, and selectively depositing metal-containing cap layers 115 on the planarized patterned substrate 1.

Figure 5:
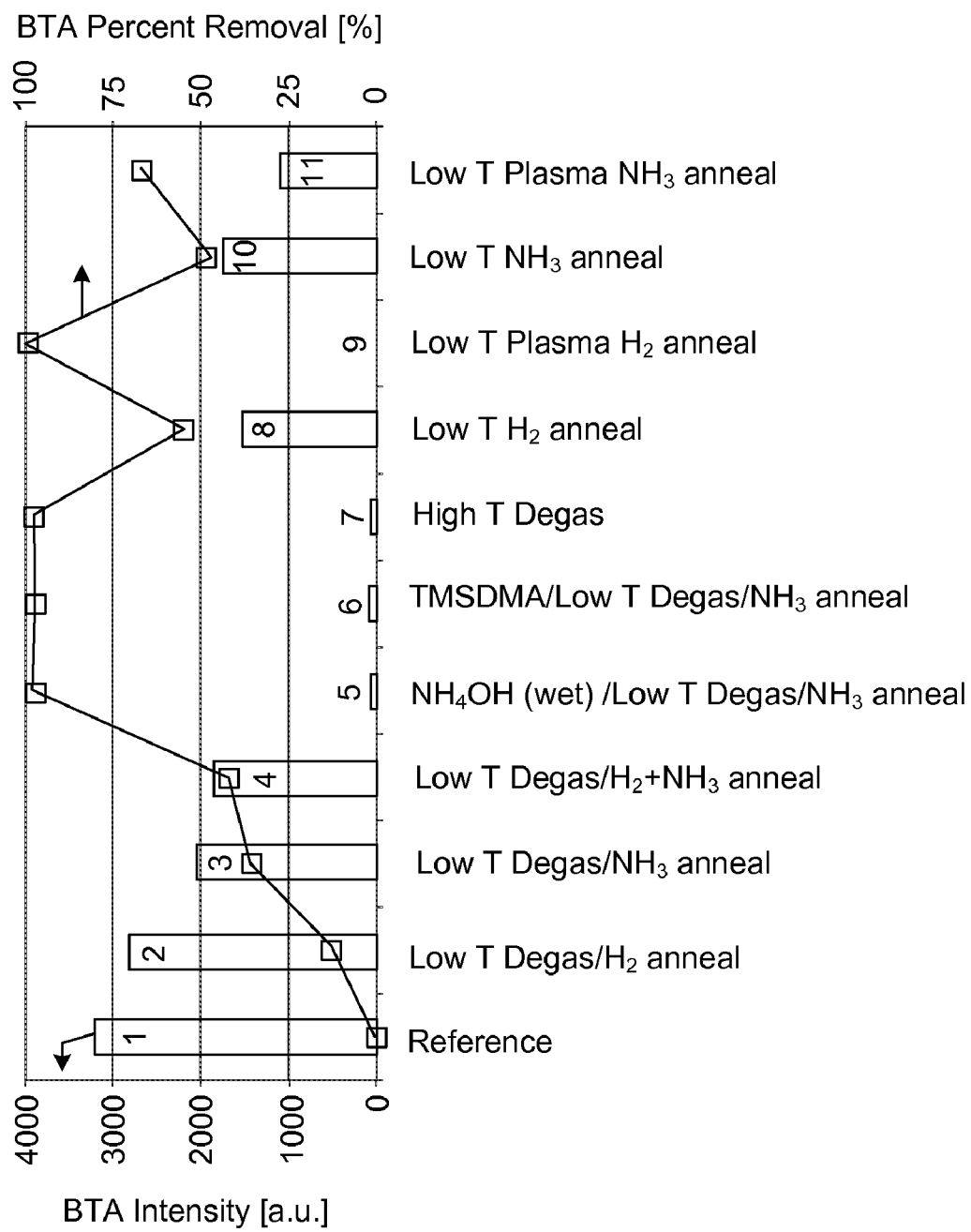
FIG. 5 shows relative BTA intensity and BTA Percent Removal as a function of substrate treatment.

FIG. 5 shows relative BTA intensity and BTA Percent Removal as a function of substrate treatment. The bottom axis shows BTA Intensity measured by time-of-flight secondary ion mass spectrocopy (ToF-SIMS). The top axis shows BTA Percent Removal based on the BTA Intensity of a treated sample compared to an untreated sample (Sample 1). The untreated samples were prepared by depositing 4 nm TaN on blanked 300 mm Si wafers by ionized physical vapor deposition (iPVD), depositing a 20 nm Cu seed layer by iPVD on the TaN, and plating 650 nm of Cu on the Cu seed layer by electrochemical plating (ECP). The plated Cu was annealed at 100° C. for 1 hour and thereafter 150 nm of Cu was removed by CMP processing that contained BTA. Sample 1 provided a reference as an untreated sample after CMP processing using BTA. Samples 2-6 were degassed at 220° C. for 80 seconds under vacuum conditions prior to further heat-treating (annealing). Sample 2 was heat-treated at 220° C. for 60 seconds in an $H_2$/Ar (10:1) gas environment using a gas pressure of 1 Torr, $H_2$ gas flow of 500 sccm and Ar flow of 50 sccm. Sample 3 was heat-treated at 220° C. for 60 seconds in an $NH_3$ gas environment using a gas pressure of 1 Torr and $NH_3$ gas flow of 1000 sccm. Sample 4 was heat-treated at 220° C. for 60 seconds in an $N_2/H_2$ (1:4) gas environment using a gas pressure of 1 Torr, $N_2$ gas flow of 500 sccm and $H_2$ gas flow of 2000 sccm. Sample 5 was treated with a $NH_4OH$ liquid solution ($NH_3$(aq)) prior to the degassing and was further heat-treated at 220° C. for 60 seconds in an $NH_3$ gas environment using a gas pressure of 1 Torr and $NH_3$ gas flow of 1000 sccm. Sample 6 was exposed to TMSDMA gas prior to the degassing and was further heat-treated at 220° C. for 60 seconds in an $NH_3$ gas environment using a gas pressure of 1 Torr and $NH_3$ gas flow of 1000 sccm. Sample 7 was degassed at 350° C. for 80 seconds under vacuum conditions. Sample 8 was heat-treated at 260° C. for 60 seconds in an $H_2$/Ar gas environment using a gas pressure of 1 Torr, $H_2$ gas flow of 500 sccm and Ar gas flow of 50 sccm. Sample 9 was heat-treated at 260° C. for 60 seconds in an $H_2$/Ar plasma environment using a gas pressure of 1 Torr, $H_2$ gas flow of 500 sccm and Ar gas flow of 50 sccm. Sample 10 was heat-treated at 260° C. for 60 seconds in an $NH_3$/Ar gas environment using a gas pressure of 1 Torr, $NH_3$ gas flow of 1000 sccm and Ar gas flow of 50 sccm. Sample 11 was heat-treated at 260° C. for 60 seconds in an $NH_3$/Ar plasma environment using a gas pressure of 1 Torr, $NH_3$ gas flow of 1000 sccm and Ar gas flow of 50 sccm.

The data in FIG. 5 shows that low-temperature (220° C.) heat-treating using $H_2$ (Sample 1), $NH_3$ (Sample 2), and $N_2/H_2$ (Sample 3) was relatively ineffective for removing BTA from the substrates. Furthermore, heat-treating in an $H_2$ gas environment at 260° C. (Sample 8), heat-treating in an $NH_3$ gas environment at 260° C. (Sample 10), and heat-treating at 260° C. in an $NH_3$ plasma environment (Sample 11) were also relatively ineffective for removing BTA from the substrates. However, high-temperature degassing at 350° C. under vacuum conditions (Sample 7), heat-treating at 260° C. in an $H_2$ plasma environment (Sample 9), treating with $NH_4OH$ solution ($NH_3$(aq)) prior to degassing and further heat-treating at 220° C. in an $NH_3$ gas environment (Sample 5) were effective in removing BTA from substrates. However, as described above, these methods are not suitable for many low-k materials due to the higher temperatures, plasma exposure, and exposure to a water-based solution. FIG. 5 further shows that a low-temperature (220° C.) exposure to a reactant gas containing TMSDMA gas and subsequent heat-treating at 220° C. in an NH$_3$ gas environment (Sample 6) was effective in removing BTA residue from a substrate.

A plurality of embodiments for integrating metal-containing cap layers into manufacturing of semiconductor devices to improve electromigration and stress migration in Cu metallization has been disclosed. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
   providing a planarized patterned substrate containing metal surfaces and dielectric layer surfaces both having a residue thereon;
   treating the planarized patterned substrate containing the residue with a reactant gas containing a hydrophobic functional group, the treating removing the residue from the metal surfaces and the dielectric surfaces and substituting the hydrophilic functional group in the dielectric layer surfaces with a hydrophobic functional group;
   exposing the treated planarized patterned substrate to a reducing gas; and
   depositing metal-containing cap layers selectively on the metal surfaces by exposing the dielectric layer surfaces and the metal surfaces to a deposition gas containing metal-containing precursor vapor.

2. The method of claim 1, wherein the residue comprises an organic residue.

3. The method of claim 2, wherein the organic reside comprises benzotriazine (BTA).

4. The method of claim 1, wherein the reducing gas comprises hydrogen (H$_2$) gas.

5. The method of claim 1, wherein the reducing gas comprises ammonia (NH$_3$) gas.

6. The method of claim 1, wherein the removing the residue further comprises:
   prior to the treating, heat-treating the planarized patterned substrate, the heat treating evaporating a portion of the residue from the planarized patterned substrate.

7. The method of claim 1, wherein the exposing the treated planarized patterned substrate to the reducing gas removes the hydrophobic functional group from the treated planarized patterned substrate.

8. The method of claim 1, wherein the reactant gas comprises a silicon-containing gas selected from an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, an alkyl amine silane, a silazane, or any combination thereof.

9. The method of claim 8, wherein the silicon-containing gas contains an alkyl amine silane selected from the group consisting of dimethylsilane dimethylamine (DMSDMA), trimethylsilane dimethylamine (TMSDMA), and bis(dimethylamino)dimethylsilane (BDMADMS).

10. The method of claim 1, wherein the metal-containing cap layers contain metal layers, metal compound layers, or alternating metal layers and metal compound layers, wherein the metal layers contain a metal element selected from platinum (Pt), gold (Au), ruthenium (Ru), cobalt (Co), tungsten (W), rhodium (Rh), iridium (Ir), or palladium (Pd), or a combination of two or more thereof, and wherein the metal compound layers contain the metal element and a non-metal dopant element selected from phosphorus (P), boron (B), nitrogen (N), fluorine (F), chlorine (Cl), bromine (Br), silicon (Si), or germanium (Ge), or a combination of two or more thereof.

11. The method of claim 1, wherein the metal-containing precursor vapor contains a metal element selected from platinum (Pt), gold (Au), ruthenium (Ru), cobalt (Co), tungsten (W), rhodium (Rh), iridium (Ir), or palladium (Pd), or a combination of two or more thereof, and wherein the deposition gas further comprises a non-metal dopant gas selected from PH$_3$, BH$_3$, B$_2$H$_6$, BF$_3$, NF$_3$, NH$_3$, N$_2$H$_4$, PF$_3$, PBr$_3$, BCl$_3$, BI$_3$, SiH$_4$, Si$_2$H$_6$, SiH$_3$Cl, SiH$_2$Cl$_2$, SiHCl$_3$, SiCl$_4$, Si$_2$Cl$_6$, SiH$_3$F, SiH$_2$F, SiHF$_3$, SiF$_4$, Si$_2$F$_6$, GeH$_4$, or GeCl$_4$, or a combination of two or more thereof.

12. The method of claim 1, wherein the treating and exposing are performed at a substrate temperature of 300° C. or lower.

13. A method of forming a semiconductor device, comprising:
   providing a planarized patterned substrate containing copper (Cu) surfaces and low-k dielectric layer surfaces both having a chemical mechanical polishing (CMP) residue thereon;
   treating the planarized patterned substrate with a silicon-containing reactant gas containing a hydrophobic functional group, the treating removing the CMP residue from the Cu surfaces and the low-k dielectric surfaces and substituting the hydrophilic functional group in the low-k dielectric layer surfaces with a hydrophobic functional group;
   exposing the treated planarized patterned substrate to ammonia (NH$_3$) gas; and
   depositing metal-containing cap layers selectively on the Cu metal surfaces by exposing the dielectric layer surfaces and the Cu metal surfaces to a deposition gas containing metal-containing precursor vapor.

14. The method of claim 13, wherein the depositing the metal-containing cap layers comprises depositing ruthenium (Ru) metal cap layers selectively on the Cu surfaces by exposing the dielectric layer surfaces and the Cu surfaces to a deposition gas containing Ru$_3$(CO)$_{12}$ precursor vapor and CO carrier gas.

15. The method of claim 13, wherein the removing the CMP residue comprises:
   prior to the treating, heat-treating the planarized patterned substrate, the heat-treating evaporating a portion of the residue from the planarized patterned substrate.

16. The method of claim 13, wherein the exposing the treated planarized patterned substrate to ammonia (NH$_3$) gas removes the hydrophobic functional group from the treated planarized patterned substrate.

17. The method of claim 13, wherein the silicon-containing gas contains an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, an alkyl amine silane, a silazane, or any combination thereof.

18. The method of claim 13, wherein the silicon-containing gas contains an alkyl amine silane selected from the group consisting of dimethylsilane dimethylamine (DMSDMA), trimethylsilane dimethylamine (TMSDMA), and bis(dimethylamino)dimethylsilane (BDMADMS).

19. The method of claim 13, wherein the metal-containing cap layers contain metal layers, metal compound layers, or alternating metal layers and metal compound layers, wherein the metal layers contain a metal element selected from platinum (Pt), gold (Au), ruthenium (Ru), cobalt (Co), tungsten (W), rhodium (Rh), iridium (Ir), or palladium (Pd), or a combination of two or more thereof, and wherein the metal compound layers contain the metal element and a non-metal dopant element selected from phosphorus (P), boron (B), nitrogen (N), fluorine (F), chlorine (Cl), bromine (Br), silicon (Si), or germanium (Ge), or a combination of two or more thereof.

20. The method of claim 13, wherein the metal-containing precursor vapor contains a metal element selected from platinum (Pt), gold (Au), ruthenium (Ru), cobalt (Co), tungsten (W), rhodium (Rh), iridium (Ir), or palladium (Pd), or a combination of two or more thereof, and wherein the deposition gas further comprises a non-metal dopant gas selected from $PH_3$, $BH_3$, $B_2H_6$, $BF_3$, $NF_3$, $NH_3$, $N_2H_4$, $PF_3$, $PBr_3$, $BCl_3$, $BI_3$, $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, $Si_2F_6$, $GeH_4$, or $GeCl_4$, or a combination of two or more thereof.

21. A method of forming a semiconductor device, comprising:

providing a planarized patterned substrate containing copper (Cu) surfaces and low-k dielectric layer surfaces with a chemical mechanical polishing (CMP) residue containing benzotriazine (BTA) formed thereon;

heat-treating the planarized patterned substrate, wherein the heat-treating evaporates a first portion of the CMP residue from the planarized patterned substrate, thereafter, treating a second portion of the CMP residue on the planarized patterned substrate with an alkyl amine silane reactant gas, the treating removing the CMP residue from the Cu surfaces and the low-k dielectric surfaces and substituting a hydrophilic functional group in the dielectric layer surfaces with a —Si—$(CH_3)_3$ functional group, and exposing the treated planarized patterned substrate to ammonia ($NH_3$) gas; and depositing ruthenium (Ru) metal cap layers selectively on the Cu surfaces by exposing the dielectric layer surfaces and the Cu surfaces to a deposition gas containing $Ru_3(CO)_{12}$ precursor vapor and CO carrier gas.

22. The method of claim 21, wherein the exposing the treated planarized patterned substrate to ammonia ($NH_3$) gas replaces the —Si—$(CH_3)_3$ functional group on the treated planarized patterned substrate with —$NH_2$ or —NH groups.

23. The method of claim 21, wherein the alkyl amine silane is selected from the group consisting of dimethylsilane dimethylamine (DMSDMA), trimethylsilane dimethylamine (TMSDMA), and bis(dimethylamino)dimethylsilane (BDMADMS).

* * * * *